US012467126B2

(12) United States Patent
Engelhart et al.

(10) Patent No.: US 12,467,126 B2
(45) Date of Patent: Nov. 11, 2025

(54) COATED CUTTING TOOL

(71) Applicant: WALTER AG, Tubingen (DE)

(72) Inventors: Wolfgang Engelhart, Metzingen (DE); Veit Schier, Echterdingen (DE)

(73) Assignee: Walter AG, Tubingen (DE)

( * ) Notice: Subject to any disclaimer, the term of this patent is extended or adjusted under 35 U.S.C. 154(b) by 698 days.

(21) Appl. No.: 17/622,376

(22) PCT Filed: Jun. 24, 2020

(86) PCT No.: PCT/EP2020/067631
§ 371 (c)(1),
(2) Date: Dec. 23, 2021

(87) PCT Pub. No.: WO2020/260357
PCT Pub. Date: Dec. 30, 2020

(65) Prior Publication Data

US 2022/0259715 A1 Aug. 18, 2022

(30) Foreign Application Priority Data

Jun. 28, 2019 (EP) .................................... 19183361

(51) Int. Cl.

| | |
|---|---|
| ***C23C 14/06*** | (2006.01) |
| ***B22F 7/06*** | (2006.01) |
| ***C23C 14/35*** | (2006.01) |
| ***C23C 30/00*** | (2006.01) |
| *B22F 5/00* | (2006.01) |

(52) U.S. Cl.
CPC ............ *C23C 14/0641* (2013.01); *B22F 7/06* (2013.01); *C23C 14/35* (2013.01); *C23C 30/005* (2013.01); *B22F 2005/001* (2013.01)

(58) Field of Classification Search
CPC .. B22F 7/06; B22F 2005/001; C23C 14/0641; C23C 14/3485; C23C 14/35; C23C 30/005
See application file for complete search history.

(56) References Cited

U.S. PATENT DOCUMENTS 8,741,011 B2 6/2014 Johansson et al.
10,023,952 B2 7/2018 Oden et al.
10,180,628 B2 1/2019 Cramer et al.
10,669,622 B2 6/2020 Oden et al.
11,440,102 B2 9/2022 Johnson
2011/0067996 A1 * 3/2011 Strand .................. C23C 14/345 204/192.15

(Continued)

FOREIGN PATENT DOCUMENTS

CN 105312600 A 5/2015
CN 108103465 A 6/2018

(Continued)

*Primary Examiner* — Seth Dumbris
(74) *Attorney, Agent, or Firm* — Corinne R. Gorski

(57) ABSTRACT

The present coated cutting tool includes a substrate with a coating including a layer of $Ti_xAl_yCr_zSi_vN$, where x is 0.30-0.50, y is 0.25-0.45, z is 0.05-0.15, and v is 0.10-0.20, x+y+z+v=1. The layer has a cubic phase with a distribution of unit cell lengths within the range 3.96 to 4.22 Å for the cubic cell. The unit cell length range 3.96 to 4.22 Å includes more than one intensity maximum in an averaged radial intensity profile of an electron diffraction pattern.

12 Claims, 6 Drawing Sheets

(56) References Cited

U.S. PATENT DOCUMENTS

| | | | | |
|---|---|---|---|---|
| 2012/0315453 | A1 | 12/2012 | Cha et al. | |
| 2014/0193637 | A1* | 7/2014 | Schier | C23C 30/00 428/472 |
| 2015/0232978 | A1* | 8/2015 | Schier | C23C 30/005 428/141 |

FOREIGN PATENT DOCUMENTS

| | | | |
|---|---|---|---|
| EP | 2298954 | A1 | 3/2011 |
| EP | 3434809 | A1 | 1/2019 |
| WO | 2014049105 | A1 | 4/2014 |

* cited by examiner

COATED CUTTING TOOL

RELATED APPLICATION DATA

This application is a § 371 National Stage Application of PCT International Application No. PCT/EP2020/067631 filed Jun. 24, 2020 claiming priority to EP 19183361.5 filed Jun. 28, 2019.

The present invention relates to a coated cutting tool particularly suitable for cutting especially hard workpiece materials (iso-H materials). The cutting tool has a coating comprising a (Ti,Al,Cr,Si)N layer.

BACKGROUND

Generally, cutting tools for metal machining comprises a substrate of a hard material such as cemented carbide, and a thin wear resistant coating deposited on the surface of the substrate. Examples of cutting tools are cutting inserts, drills or endmills.

The coating should ideally have a high hardness but at the same time possess sufficient toughness in order to withstand severe cutting conditions as long as possible.

Depending on the workpiece material to be cut there are different demands on the cutting tool. In connection with this the properties of a coating on a cutting tool are very important.

One group of workpiece materials are hardened materials such as hardened steel, chilled cast iron and white cast iron. This group of materials is classified as iso-H materials. They are especially hard and difficult to cut due to the high cutting forces needed. Materials belonging to the iso-H group generate a lot of heat during the cutting operation. Also there is a high level of wear on the cutting edge.

State of the art coatings used for cutting tools for machining iso-H materials are generally (Ti,Al)N coatings deposited by a PVD process. (Ti,Al)N coatings have high hardness and high toughness but lack sufficient high-temperature stability.

US 2015/0232978 A1 discloses a coated cutting tool with a coating comprising a multilayer of sub-layers of (Ti,Al)N, (Al,Cr)N and (Ti,Si)N, the average composition being about $Ti_{0.45}Al_{0.40}Cr_{0.10}Si_{0.05}N$. The coating is deposited by cathodic arc evaporation.

EP 3434809 A1 discloses a coated cutting tool with a (Ti,Al,Cr,Si)N coating comprising a multilayer of sub-layers of (Ti,Si)N and (Al,Cr)N. The coating is deposited by cathodic arc evaporation.

The object of the present invention is to provide a coated cutting tool with excellent high-temperature stability and improved tool life, especially when cutting iso-H workpiece materials.

THE INVENTION

Figure 1:
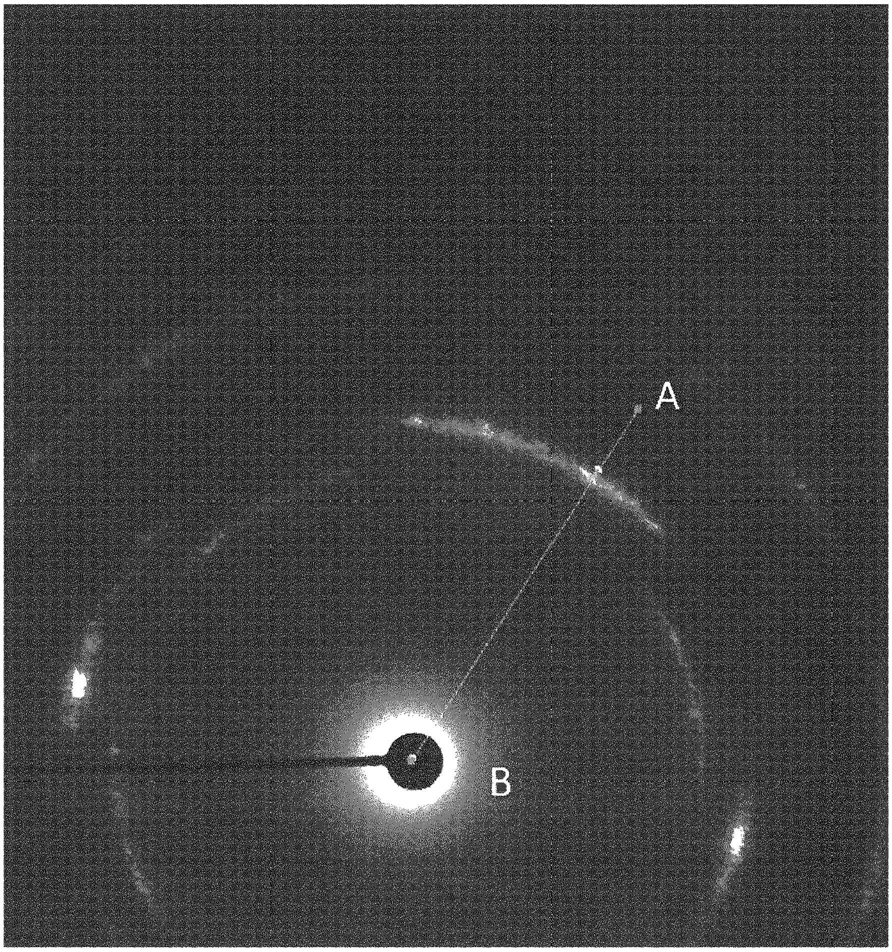
FIG. 1 shows an electron diffraction image of a (Ti,Al,Cr,Si)N layer according to the invention.

It has now been provided a coated cutting tool comprising a substrate with a coating comprising a layer of (Ti,Al,Cr,Si)N, said (Ti,Al,Cr,Si)N comprising a cubic phase having more than one unit cell length.

Thus, there is herein disclosed a coated cutting tool comprising a substrate with a coating comprising a layer of $Ti_xAl_yCr_zSi_vN$, x is 0.30-0.50, y is 0.25-0.45, z is 0.05-0.15, and v is 0.10-0.20, x+y+z+v=1, which comprises a cubic phase comprising a distribution of unit cell lengths within the range 3.96 to 4.22 Å for the cubic cell and within the unit cell length range 3.96 to 4.22 Å comprises more than one intensity maximum in an averaged radial intensity profile of an electron diffraction pattern.

An averaged radial intensity profile is obtained from an electron diffraction pattern by providing an average of all intensities in the diffraction pattern with the same distance (radius) to the center of the diffraction pattern. Then, the averaged intensities are drawn as a function of the radius.

The presence of more than one unit cell length results in that there is more than one lattice plane spacing for a specific (hkl) plane. As an example, the layer of (Ti,Al,Cr,Si)N of the present invention comprises a general cubic structure in which there are more than one lattice plane spacing present giving a (200) reflection.

The presence of more than one unit cell length can be detected by XRD or TEM analysis (electron diffraction). For example, in a radial averaged intensity profile in electron diffraction the (200) reflection intensity is in one embodiment distributed so that three maximas are seen (see FIG. 2). The maximas in this specific example of the invention correspond to d-spacings of 2.01, 2.04 and 2.07 Å. More than one maximum for other reflections, such as (111), (200) and (222), may also be present in embodiments of the present invention.

In theta-2theta XRD analysis the presence of more than one unit cell length influences the shape of the diffraction peak for a specific (hkl) reflection due to the presence of different lattice plane spacings which cause the diffraction.

In one embodiment, the layer of $Ti_xAl_yCr_zSi_vN$ comprises a cubic phase which within the unit cell length range 3.96 to 4.22 Å comprises from two to four intensity maxima in an intensity profile of an electron diffraction pattern.

In one embodiment, the layer of $Ti_xAl_yCr_zSi_vN$ comprises a cubic phase which within the unit cell length range 3.96 to 4.22 Å comprises three intensity maxima in the intensity profile of an electron diffraction pattern, the maxima are situated within the ranges 4.00-4.04 Å, 4.06-4.10 Å and 4.12-4.16 Å, respectively.

In the layer of $Ti_xAl_yCr_zSi_vN$, x is preferably 0.35-0.45, y is preferably 0.30-0.40, z is preferably 0.08-0.13, and v is preferably 0.12-0.18, x+y+z+v=1.

In one embodiment, the layer of $Ti_xAl_yCr_zSi_vN$ has a hardness of from 3300 to 3700 HV, preferably from 3500 to 3700 HV.

In one embodiment, the layer of $Ti_xAl_yCr_zSi_vN$ has a reduced Young's modulus of ≥320 GPa, preferably ≥340 GPa.

In one embodiment, the layer of $Ti_xAl_yCr_zSi_vN$ has a residual stress of from −3 to −6 GPa.

In one embodiment, the layer of $Ti_xAl_yCr_zSi_vN$ has a thermal conductivity of less than 3 W/mK, preferably from 1.8 to 2.8 W/mK.

For wear resistant coatings on cutting tools a low thermal conductivity is beneficial to keep the thermal load from the cutting process on the tool substrate as low as possible.

The thickness of the layer of $Ti_xAl_yCr_zSi_vN$ is suitably from 0.5 to 6 μm, preferably from 1.5 to 4 μm.

In one embodiment, there is at least one metal nitride layer between the substrate and the layer of $Ti_xAl_yCr_zSi_vN$, the metal nitride layer is suitably a nitride of one or more of Ti, Cr and Zr, optionally together with Al. Preferably the metal nitride layer is a layer of TiN or (Ti,Al)N. The metal nitride layer acts as an adhesion enhancing layer between the $Ti_xAl_yCr_zSi_vN$ layer and the substrate.

The thickness of the at least one metal nitride layer between the substrate and the layer of $Ti_xAl_yCr_zSi_vN$ is suitably from 0.1 to 3 μm, preferably from 0.5 to 2 μm.

The substrate of the coated cutting tool can be of any kind common in the field of cutting tools for metal machining. The substrate is suitably selected from cemented carbide, cermet, cBN, ceramics, PCD and HSS.

In one preferred embodiment, the substrate is cemented carbide.

In one preferred embodiment, the coated cutting tool comprises a substrate of cemented carbide with a coating comprising a 0.5 to 6 μm layer of $Ti_xAl_yCr_zSi_vN$, x is 0.30-0.50, y is 0.25-0.45, z is 0.05-0.20, and v is 0.10-0.20, x+y+z+v=1, which comprises a cubic phase comprising a distribution of unit cell lengths within the range 3.96 to 4.22 Å for the cubic cell, there is a 0.1 to 3 μm layer of (Ti,Al)N between the substrate and the layer of $Ti_xAl_yCr_zSi_vN$.

The coated cutting tool can be a coated cutting insert, such as a coated cutting insert for turning or a coated cutting insert for milling, or a coated cutting insert for drilling, or a coated cutting insert for threading, or a coated cutting insert for parting and grooving. The coated cutting tool can also be a coated solid tool such as a solid drill, an endmill, or a tap.

The layer of $Ti_xAl_yCr_zSi_vN$ is preferably a sputter-deposited layer, most preferably a HIPIMS (High Power Impulse Magnetron Sputtering)-deposited layer.

When depositing the $Ti_xAl_yCr_zSi_vN$ a target containing all of the elements Ti, Al, Cr and Si is preferably used.

The method of producing the coated cutting tool as herein disclosed comprises providing a substrate and depositing, preferably in HIPIMS mode, a layer of $Ti_xAl_yCr_zSi_vN$, x is 0.30-0.50, y is 0.25-0.45, z is 0.05-0.20, and v is 0.10-0.20, x+y+z+v=1. When HIPIMS mode is used the peak power density is suitably >0.2 kW/cm$^2$, preferably >0.4 kW/cm$^2$, most preferably >0.7 kW/cm$^2$, the peak current density suitably >0.2 A/cm$^2$, preferably >0.3 A/cm$^2$, most preferably >0.4 A/cm$^2$, and the maximum peak voltage suitably 300-1500 V, preferably 400-900 V.

The substrate temperature during the deposition is suitably from 350 to 600° C., preferably from 400 to 550° C.

The DC bias voltage used in a HIPIMS process is suitably 20-100 V, or 30-80 V (negative bias).

The average power density in a HIPIMS process is suitably 20-110 W·cm$^{-2}$, preferably 30-90 W·cm$^{-2}$. The pulse length used in a HIPIMS process is suitably from 2 μs to 200 ms, preferably from 10 μs to 100 ms.

In the deposition process there is preferably used one or more targets of TiAlCrSi, then of the same composition. In one embodiment three targets (one row) are used.

As is common in PVD deposition of metal nitrides there can be a slight over-stoichiometry or slight under-stoichiometry of nitrogen in the metal nitride. Thus, the nitrogen content in relation to the total metal content in (Ti,Al,Cr,Si)N may be outside completely stoichiometry 1:1 and may be several atomic percentage units above or below 50 at. %, such as 40-60 at % or 50-58 at. %.

Methods

XRD-Phase Analysis:

The X-ray diffraction patterns concerning the phase analysis were acquired by Grazing incidence mode (GIXRD) on a diffractometer from Panalytical (Empyrean). CuKalpha-radiation with line focus was used for the analysis (high tension 40 kV, current 40 mA). The incident beam was defined by a 2 mm mask and a ⅛° divergence slit in addition with a X-ray mirror producing a parallel X-ray beam. The sideways divergence was controlled by a Soller slit (0.04°). For the diffracted beam path a 0.18° parallel plate collimator in conjunction with a proportional counter (OD-detector) was used. The measurement was done in grazing incidence mode (Omega=1°). The 2Theta range was about 28-45° with a step size of 0.03° and a counting time of 10 s. For the XRD-line-profile analysis a reference measurement (with LaB6-powder) was done with the same parameters as listed above to correct for the instrumental broadening.

TEM-Analysis

The Transmission Electron Microscopy data (selected area diffraction patterns and dark field images) was acquired by a Transmission Electron Microscope from FEI (FEI TITAN 80-300). For the analysis, a high tension of 300 kV was used.

When reference is made herein to electron diffraction experiments these are TEM measurements which were carried out with parallel illumination. The area of interest was selected with a selected area aperture.

For TEM sample preparation a FIB (Focused Ion Beam) Lift out was used. For the final polishing the Ga-Ion beam was adjusted to a current of 200 pA at 5 kV.

A cross-section of the coating was analysed perpendicular to surface of the coating.

Residual Stress:

For the analysis of the residual stresses in the coating a diffractometer from Seifert/GE (PTS 3003) was used. $CuK_{alpha}$-radiation with a polycapillary lens (for producing a parallel beam) was applied for the analysis (high tension 40 kV, current 40 mA). The incident beam was defined by a 2 mm pinhole. For the diffracted beam path an energy dispersive detector (Meteor 0D) was used. X-ray stress analysis was carried out according to the $\sin^2\psi$-method. For the stress analysis the {111}-reflection of cubic TiAlN was used with the X-ray elastic constants of $s_1=-4{,}910\cdot10^{-7}$ MPa$^{-1}$ and $0.5s_2=2{,}780\cdot10^{-6}$ MPa$^{-1}$. The stresses were measured applying the chi-mode tilting the chi-axis from −60°-60° with equidistant intervals in $\sin^2\psi$.

Vickers Hardness:

The Vickers hardness was measured by means of nano indentation (load-depth graph) using a Picodentor HM500 of Helmut Fischer GmbH, Sindelfingen, Germany. For the measurement and calculation the Oliver and Pharr evaluation algorithm was applied, wherein a diamond test body according to Vickers was pressed into the layer and the force-path curve was recorded during the measurement. The maximum load used was 15 mN (HV 0.0015), the time period for load increase and load decrease was 20 seconds each and the holding time (creep time) was 10 seconds. From this curve hardness was calculated.

Reduced Young's Modulus

The reduced Young's modulus (reduced modulus of elasticity) was determined by means of nano-indentation (load-depth graph) as described for determining the Vickers hardness.

Thermal Conductivity:

The Time-Domain-Thermal Reflectance (TDTR)-Method was used which has the following characteristics:

1. A laser pulse (Pump) is used to heat the sample locally.
2. Depending on the thermal conductivity and heat capacity, the heat energy is transferred from the sample surface towards the substrate. The temperature on the surface decreases by time.
3. The part of the laser being reflected depends on the surface temperature. A second laser pulse (probe pulse) is used for measuring the temperature decrease on the surface.
4. By using a mathematical model the thermal conductivity can be calculated. Reference is made to (D. G. Cahill, Rev. Sci. Instr. 75, 5119 (2004)).

Thickness:

The thickness of a layer was determined by calotte grinding. Thereby a steel ball was used having a diameter of 30 mm for grinding the dome shaped recess and further the ring diameters were measured, and the layer thicknesses were calculated therefrom. Measurements of the layer thickness on the rake face (RF) of the cutting tool were carried out at a distance of 2000 μm from the corner, and measurements on the flank face (FF) were carried out in the middle of the flank face.

EXAMPLES

Example 1 (Invention)

A (Ti,Al)N layer from a target with the composition $Ti_{0.40}Al_{0.60}$ was deposited onto WC-Co based substrates being cutting inserts of a milling type and as well flat inserts (for easier analysis of the coating) using HIPIMS mode in an Oerlikon Balzers equipment using S3p technology.

The substrates had a composition of 8 wt % Co and balance WC.

The deposition process was run in HIPIMS mode using the following process parameters Average power: 9.06 kW
Pulse on time: 7.56 ms
Temperature: 450° C.
Target size: circular, diameter 15 cm
Target material: Ti40Al60
Total pressure: 0.6 Pa
Argon pressure: 0.42 Pa
Bias potential: −40 V
A layer thickness of about 1 μm was deposited.

Then, a layer of (Ti,Al,Cr,Si)N was deposited onto the previously deposited (Ti,Al)N layer. A single target was used of the composition Ti/Al/Cr/Si being 40/35/10/15 (at %).

The deposition process was run in HIPIMS mode using the following process parameters:

Average power per target: 4.8 kW
Peak pulse power: 60 kW
Max. peak voltage: 640 V Peak pulse current: 92 A
Pulse on time: 2 ms
Temperature: 450° C.
Target size: circular, diameter 15 cm (the effective area of the plasma was one third of the target area)
Target material: Ti40Al35Cr10Si15
Total pressure: 0.62 Pa
Argon pressure: 0.42 Pa
Bias potential: −50 V (−40 V for the first 10 minutes)
A layer thickness of about 2.5 μm was deposited.

The coated cutting tool provided is called "Sample 1 (invention)"

The content of each element in the (Ti,Al,Cr,Si)N layer was analysed with Energy Dispersive X-Ray Spectroscopy (EDS). The result is seen in Table 1.

TABLE 1

| Element | Ti | Al | Cr | Si | N | Ar |
|---|---|---|---|---|---|---|
| Content (at. %) | 16.8 | 15.5 | 4.7 | 7.3 | 55.4 | 0.2 |

Example 2 (Reference)

A (Ti,Al)N layer from a target with the composition $Ti_{0.40}Al_{0.60}$ was deposited onto WC-Co based substrates being cutting inserts of a milling type and as well flat inserts (for easier analysis of the coating) using HIPIMS mode in an Oerlikon Balzers equipment using S3p technology.

The substrates had a composition of 8 wt % Co and balance WC.

The deposition process was run in HIPIMS mode using the following process parameters Average power: 9.06 kW
Pulse on time: 7.56 ms
Temperature: 450° C.
Target size: circular, diameter 15 cm
Target material: Ti40Al60
Total pressure: 0.6 Pa
Argon pressure: 0.42 Pa
Bias potential: −40 V
A layer thickness of about 3 μm was deposited.

The coated cutting tool provided is called "Sample 2 (reference)"

Example 3 (Reference)

A (Ti,Al)N layer from a target with the composition $Ti_{0.33}Al_{0.67}$ was deposited onto WC-Co based substrates being cutting inserts of a milling type and as well flat inserts (for easier analysis of the coating).

The substrates had a composition of 8 wt % Co and balance WC.

The deposition was performed in an Innova PVD equipment from the manufacturer Oerlikon-Balzers. The process parameters were:

target Ti33Al67
total pressure: 1 Pa $N_2$
temperature at deposition: 600° C.
DC bias: −100 V
arc current: 140 A
table (substrate) rotation: 60%
magnet configuration: Mag10
A layer thickness of about 3 μm was deposited.

The coated cutting tool provided is called "Sample 3 (reference)"

Example 4 (Reference)

A (Ti,Al,Cr,Si)N coating according to US 2015/023978 A1 was deposited by cathodic arc evaporation from a $Ti_{0.50}Al_{0.50}$ target, a $Al_{0.70}Cr_{0.30}$ target and a $Ti_{0.85}Si_{0.15}$ target being a nano-multilayer of (approximately) $Ti_{0.50}Al_{0.50}N$, $Al_{0.70}Cr_{0.30}N$ and $Ti_{0.85}Si_{0.15}N$.

The coating is made of an alternating multilayer A-B wherein layer A in itself is a nano-multilayer of sub-layers $Al_{0.70}Cr_{0.30}N$ and $Ti_{0.85}Si_{0.15}N$ each being about 7 nm. The thickness of A being about 56 nm.

Layer B is a $Ti_{0.50}Al_{0.50}N$ layer with a thickness of about 50 nm.

The layer sequence A-B is repeated 20 times.

The total thickness of the coating is about 2 μm.

The average composition of the (Ti,Al,Cr,Si)N coating being approximately $Ti_{0.45}Al_{0.40}Cr_{0.10}Si_{0.05}N$.

The coating was deposited onto WC-Co based substrates being cutting inserts of a milling type and as well flat inserts (for easier analysis of the coating). The substrates had a composition of 8 wt % Co and balance WC. The deposition was made in an Innova PVD equipment from the manufacturer Oerlikon-Balzers.

Layer A: 2× $Ti_{0.85}Si_{0.15}N$ and 2× $Al_{0.70}Cr_{0.30}N$ (two targets each in the deposition chamber), process conditions:

N2 pressure: 4 Pa
temperature: 550° C.
arc-Current: 160 A
DC bias: −60 V
rotation: 30%
deposition time: 2 min 40 s Layer B: 2× $Ti_{0.50}Al_{0.50}N$ (two targets in the deposition chamber), process conditions:

N2 pressure: 4 Pa
temperature: 550° C.
arc Current: 160 A
DC bias: −120V
rotation: 30%
deposition time: 5 min 20 s Magnet konfiguration:

$Ti_{0.85}Si_{0.15}$: Mag6, 0.5 A
$Ti_{0.50}Al_{0.50}$: Mag6, 2 A
$Al_{0.70}Cr_{0.30}$: Mag14, 0.5 A

In total [A-B] has 20 repetitions.

The coated cutting tool provided is called "Sample 4 (reference)".

Example 5 (Analysis)

Electron diffraction (TEM) analysis was made on Sample 1 (invention). FIG. 1 shows the electron diffraction pattern obtained.

Figure 2:
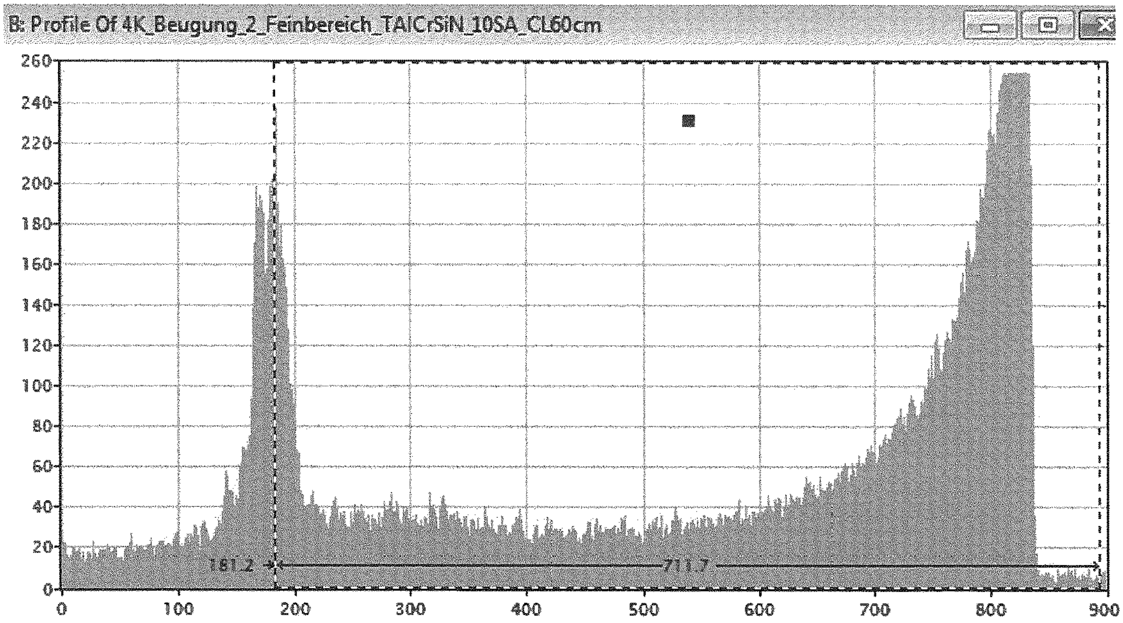
FIG. 2 shows a radial intensity distribution curve for an electron diffraction image of a (Ti,Al,Cr,Si)N layer according to the invention.

FIG. 2 shows a radial intensity distribution profile along a line A-B in the electron diffractogram of Sample 1 (invention).

Figure 3:
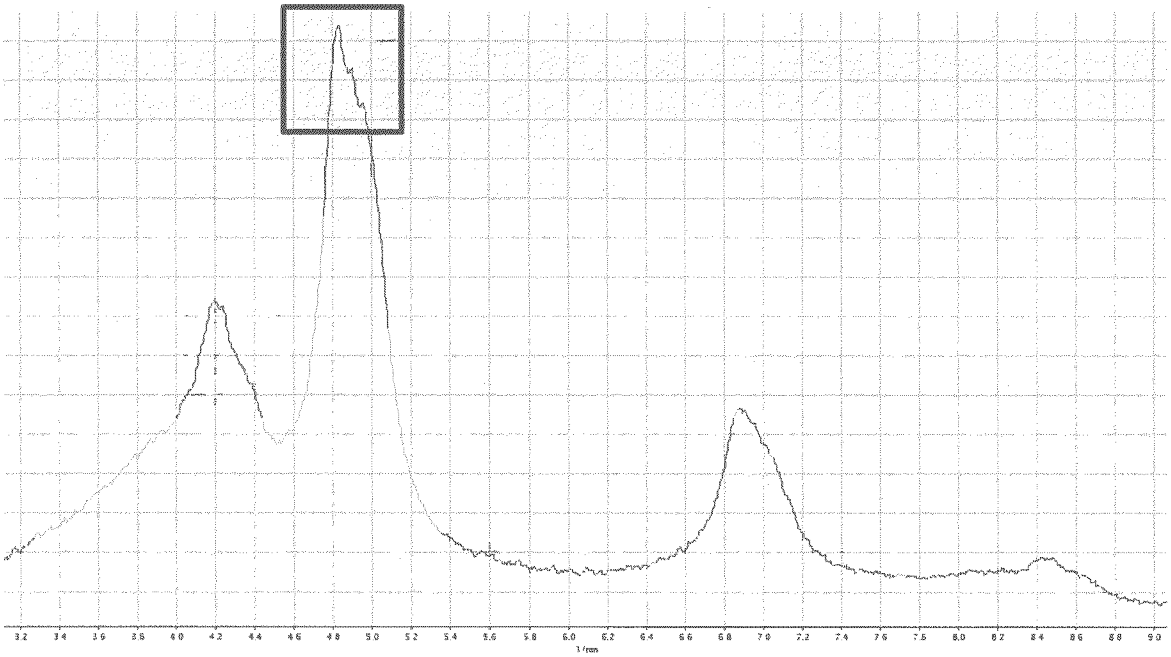
FIG. 3 shows an averaged radial intensity distribution curve for an electron diffraction image of a (Ti,Al,Cr,Si)N layer according to the invention.

FIG. 3 shows an averaged radial intensity distribution profile for the electron diffractogram of Sample 1 (invention).

Figure 3A:
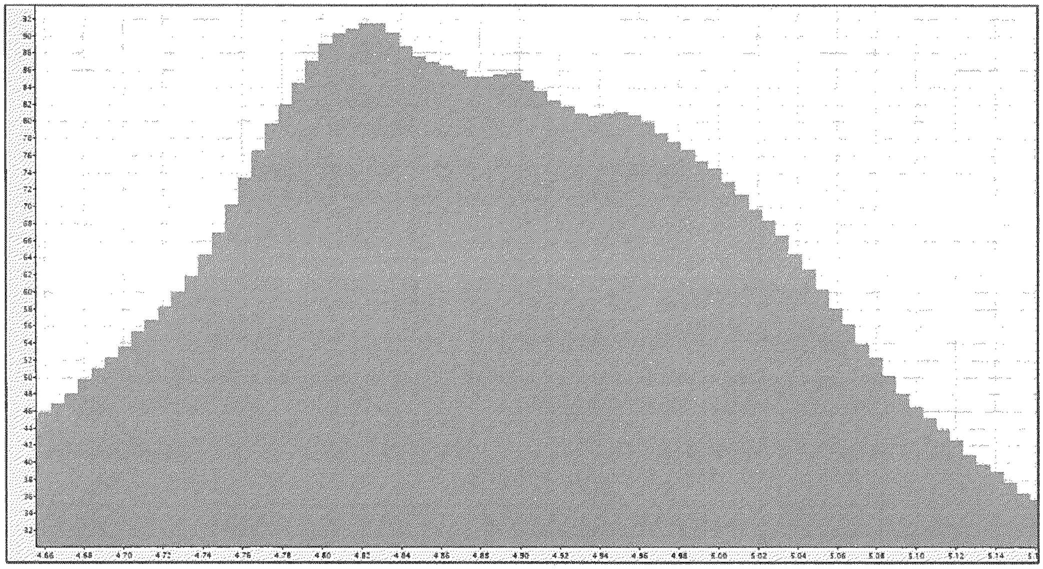
FIG. 3*a* shows an enlarged part of an averaged radial intensity distribution curve for an electron diffraction image of a (Ti,Al,Cr,Si)N layer according to the invention.

FIG. 3*a* shows an enlarged image of the marked part, corresponding to the cubic (200) reflection, of FIG. 3.

It is seen that the averaged intensity profile of the (200) reflection discloses three preferred maxima. This means that there are more than one preferred d-spacing for the cubic phase, which corresponds to the presence of more than one preferred unit cell length for the (Ti,Al,Cr,Si)N of Sample 1 (invention).

XRD theta-2theta analysis was further made on Sample 1, 2 and 4.

Figure 4:
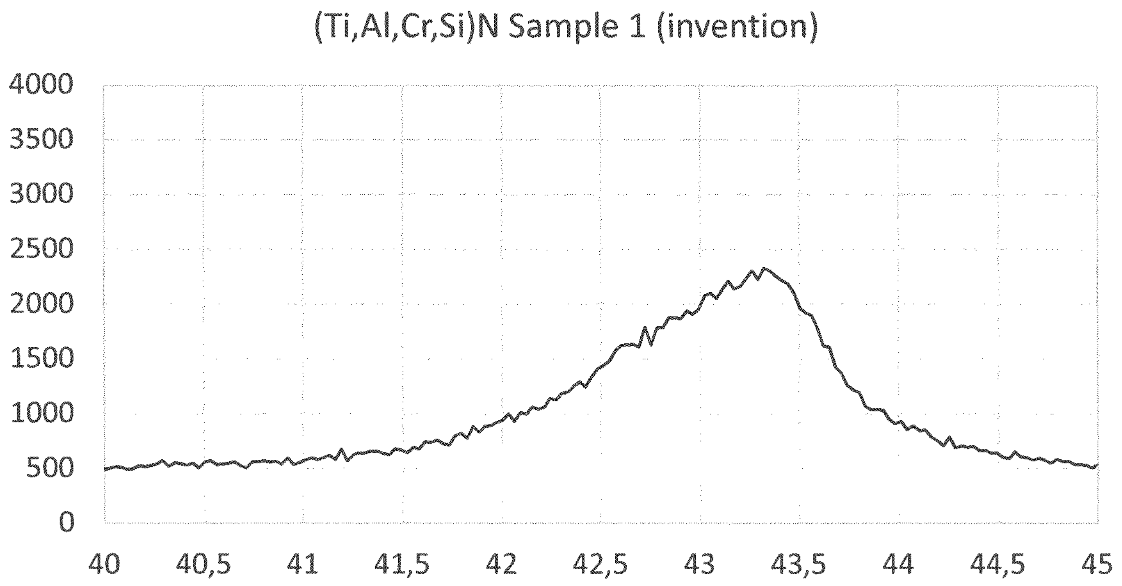
FIG. 4 shows an X-ray theta-2theta diffractograms for a (Ti,Al,Cr,Si)N layer according to the invention for the cubic (200) peak.

FIG. 4 shows the X-ray theta-2theta diffractograms for Sample 1 (invention) in the 2theta range 40-45 degrees showing the cubic (200) peak.

Figure 5:
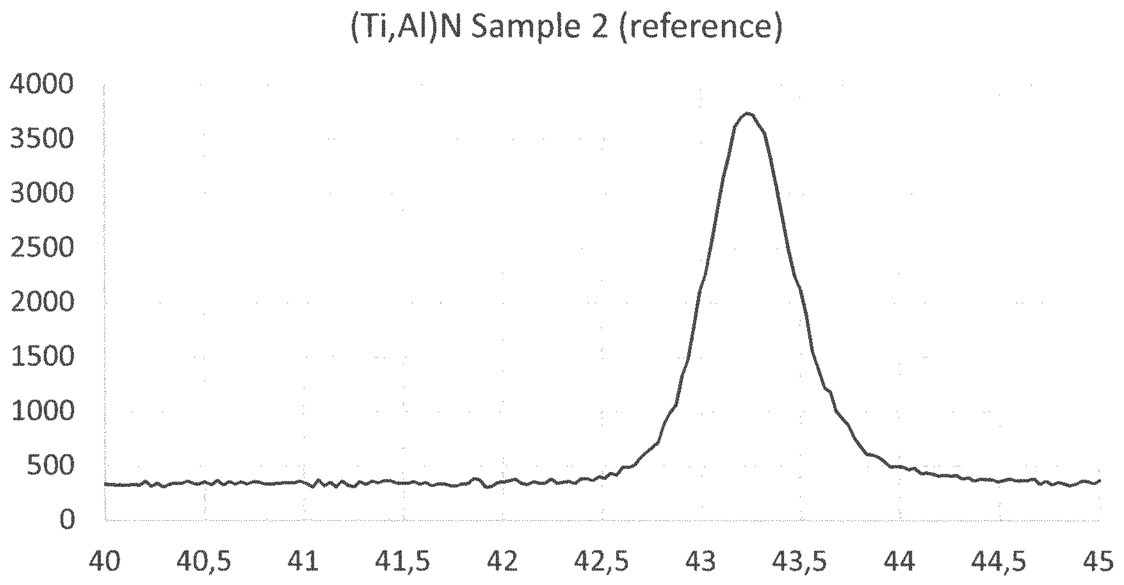
FIG. 5 shows X-ray theta-2theta diffractogram for a HIPIMS-deposited (Ti,Al)N layer for the cubic (200) peak.

FIG. 5 shows X-ray theta-2theta diffractogram for Sample 2 (reference), an HIPIMS-deposited (Ti,Al)N layer, in the 2theta range 40-45 degrees showing the cubic (200) peak.

Figure 6:
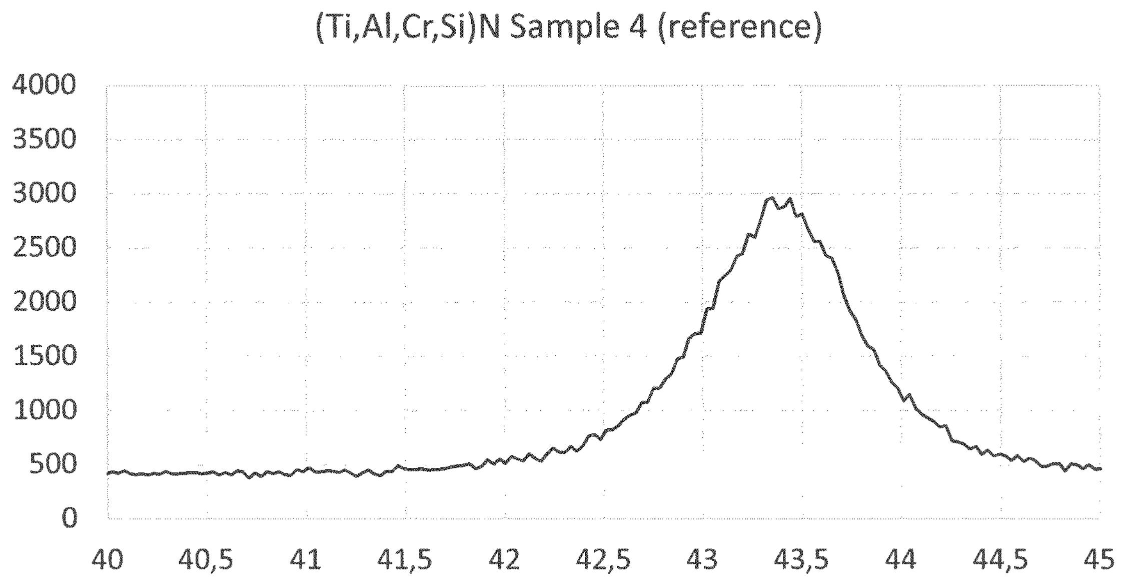
FIG. 6 shows X-ray theta-2theta diffractogram for an arc-deposited (Ti,Al,Cr,Si)N layer for the cubic (200) peak.

FIG. 6 shows X-ray theta-2theta diffractogram for Sample 4 (reference), an arc-deposited (Ti,Al,Cr,Si)N layer, in the 2theta range 40-45 degrees showing the cubic (200) peak.

It is seen that the peak for Sample 1 (invention) is very assymetrical indicating the presence of more than one preferred d-spacing for the (200) reflection. The peaks for Sample 2 and Sample 4 on the other hand are very symmetrical.

Residual stress was also measured on Sample 1 (invention) showing a value of −5.1+−0.3 GPa, i.e., compressive.

Hardness measurements (load 15 mN) were carried out on the flank face of the coated tool to determine Vickers hardness and reduced Young modulus (EIT). Table 2 shows the results. For characterization of toughness (Young's modulus) of the coatings Vickers indents with a load of 500 mN were carried out and cross section prepared.

TABLE 2

| Coating | Hardness HV [Vickers] | EIT [GPa] |
|---|---|---|
| Sample 1 (invention) | 3500 | 350 |

Finally, for the (Ti,Al,Cr,Si)N layer of Sample 1 (invention) the thermal conductivity was determined to be 2.4 W/mK.

Example 6 (High-Temperature Stability)

The high temperature stability of the HIPIMS-deposited (Ti,Al,Cr,Si)N layer according to the invention, present in the coating of Sample 1 (invention) was compared with Sample 3 (reference), i.e., a HIPIMS-deposited (also S3p technology) (Ti,Al)N coating. The (Ti,Al,Cr,Si)N coating was deposited according to the process in Example 1. In this coating, however, no inner (Ti,Al)N layer was deposited.

In order to analyse the high-temperature stability, the coated inserts were placed in a furnace tube and subjected to an annealing procedure. The temperature was increased during one hour to a maximum temperature and then kept at that temperature for one hour. Within the furnance tube there was an argon pressure of about 2 bar. After heat treatment, there was no active cooling. The equipment for the experiment was from the manufacturer Nabertherm.

Hardness measurements were made through nano-indentation and Martens Hardness (in GPa) was determined. As deposited the (Ti,Al)N coating had a hardness of 18.7 GPa, while as deposited the (Ti,Al,Cr,Si)N coating had a hardness of 16.4 GPa. The situation changed by annealing at 1000° C. for one hour. The hardness of the (Ti,Al)N coating decreased to a value of 16.2 GPa whereas the hardness of the (Ti,Al,Cr,Si)N coating increased slightly to a value of 17.5 GPa. Thus, the (Ti,Al)N coating deteriorates at 1000° C. while the (Ti,Al,Cr,Si)N does not.

Figure 7:
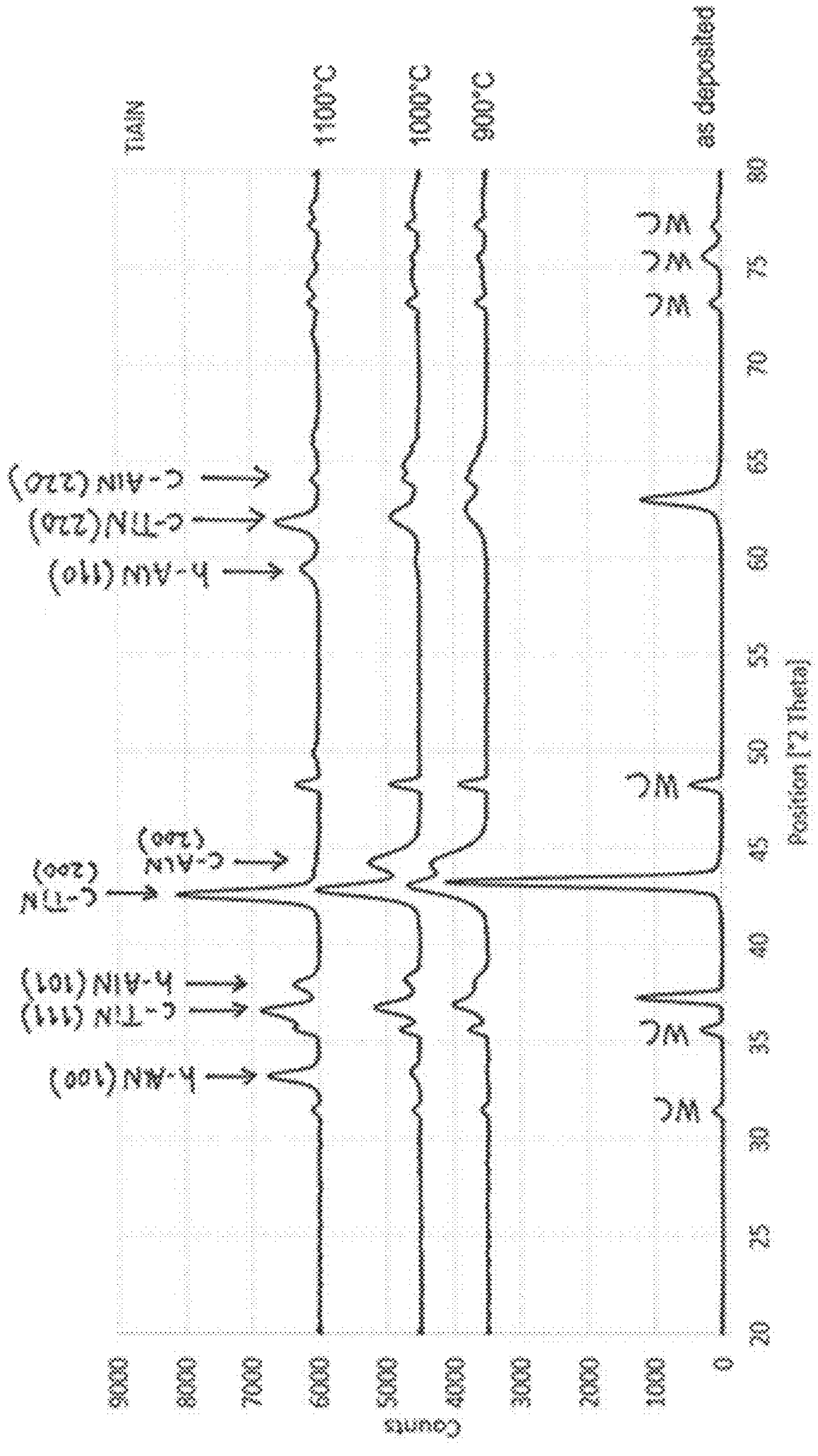
FIG. 7 shows X-ray theta-2theta diffractograms for a (Ti,Al)N layer as deposited and after different heat treatment temperatures.
Figure 8:
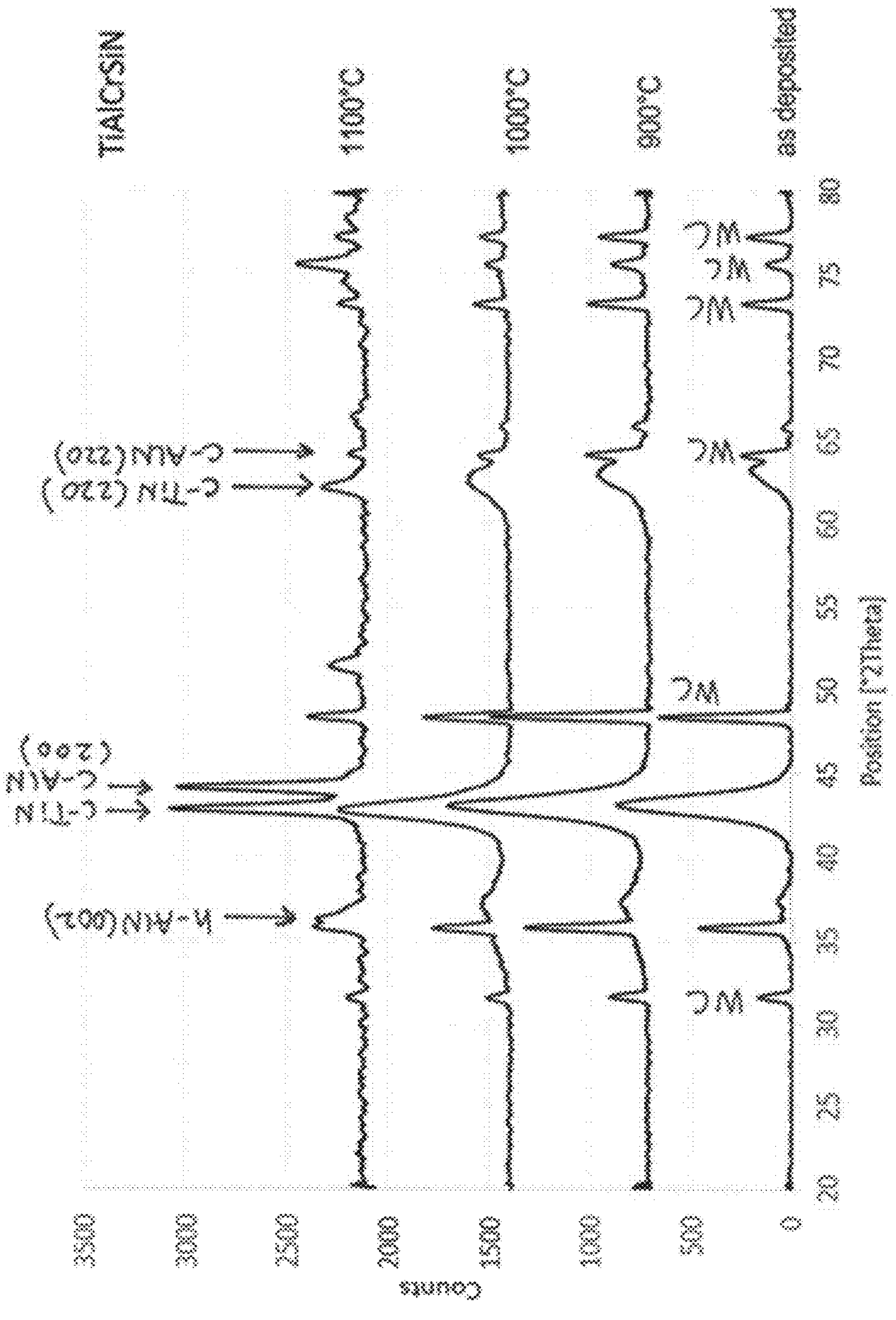
FIG. 8 shows X-ray theta-2theta diffractograms for a (Ti,Al,Cr,Si)N layer according to the invention as deposited and after different heat treatment temperatures.

The stability at high temperatures for the (Ti,Al,Cr,Si)N coating is also seen in XRD analysis. XRD measurements (theta-2theta analysis) were made on both the (Ti,Al)N coating and the (Ti,Al,Cr,Si)N coating in an as-deposited state, after annealing at 900° C., 1000° C., and 1100° C. FIG. 7 shows the diffractograms for the (Ti,Al)N coating and FIG. 8 shows the diffractograms for the (Ti,Al,Cr,Si)N. There are clear differences between the diffractograms of the different coatings. for example, at 900° C. and 1000° C. one sees a splitting of the (200) peak for TiAlN (see FIG. 7). By adding Cr and Si, the decompositon shifts to higher temperatures, i.e. to 1100° C. (see FIG. 8). Also, the (Ti,Al)N coating gets a hexagonal AlN (100) peak at 1100° C. which the (Ti,Al,Cr,Si)N according to the invention does not.

Example 7

Cutting Test of Sample 1 (Invention) and Sample 3 (Reference)

Sample 1 (invention) and the reference were tested in a milling test, and the localized flank wear was measured. The cutting conditions are summarized in Table 3.
Cutting Conditions:

TABLE 3

| | |
|---|---|
| Tooth Feed $f_z$ [mm/tooth] | 0.1 |
| Cutting speed $v_c$ [m/min] | 120 |
| Cutting width $a_e$ [mm] | 0.5 (0.1 × tool diameter) |
| Cutting depth $a_p$ [mm] | 0.5 |
| Workpiece Material | ISO-H; 1.2379 (62HRC) |
| Stop Criteria | VBmax ≥ 0.2 mm |

In this test the wear maximum was observed at the cutting edge on the flank side. Two cutting edges were tested of each coating and the averaged value for each cutting length is shown in Table 4.

TABLE 4

| | Cutting length (m) | | | | |
|---|---|---|---|---|---|
| Sample | 38 | 76 | 114 | 152 | 190 |
| Sample 1 (invention) $VB_{max}$ [mm] | 0.0175 | 0.0225 | 0.033 | 0.050 | 0.065 |
| Sample 3 (reference) $VB_{max}$ [mm] | 0.0225 | 0.050 | 0.0625 | 0.080 | >>0.2 (interrupted) |

It is concluded that Sample 3 (reference) performs much worse than Sample 1 (invention).
Cutting Test of Sample 4 (Reference):

Sample 4 (reference) was tested in a separate test round with the same cutting test parameters as testing Sample 1 and Sample 3 above, including the same workpiece material. The test had to be stopped already after a cutting length of 76 m due to a heavy wear seen as a VBmax of 0.25 mm.

It is concluded that Sample 4 (reference) performs much worse than Sample 1 (invention) which was tested in an identical test above.

The invention claimed is:

1. A coated cutting tool comprising a substrate with a coating, the coating having a layer of $Ti_xAl_yCr_zSi_vN$, wherein x is 0.30-0.50, y is 0.25-0.45, z is 0.05-0.15, and v is 0.10-0.20, and wherein x+y+z+v=1, the layer of $Ti_xAl_yCr_zSi_vN$ including a cubic phase, wherein the cubic phase has a distribution of unit cell lengths within the range 3.96 to 4.22 Å per cubic cell and, which within a unit cell length range 3.96 to 4.22 Å includes more than one intensity maximum in an averaged radial intensity profile of an electron diffraction pattern.

2. The coated cutting tool according to claim 1, wherein the cubic phase within the unit cell length range 3.96 to 4.22 Å includes from two to four intensity maxima in the averaged radial intensity profile of the electron diffraction pattern.

3. The coated cutting tool according to claim 1, wherein the cubic phase within the unit cell length range 3.96 to 4.22 Å includes three intensity maxima in the averaged radial intensity profile of the electron diffraction pattern, the maxima being situated within the ranges 4.00-4.04 Å, 4.06-4.10 Å and 4.12-4.16 Å, respectively.

4. The coated cutting tool according to claim 1, wherein the layer of $Ti_xAl_yCr_zSi_vN$ has a hardness of from 3300 to 3700 HV.

5. The coated cutting tool according to claim 1, wherein the layer of $Ti_xAl_yCr_zSi_vN$ has a reduced Young's modulus of ≥320 GPa.

6. The coated cutting tool according to claim 1, wherein the layer of $Ti_xAl_yCr_zSi_vN$ has a residual stress of from −3 to −6 GPa.

7. The coated cutting tool according to claim 1, wherein the layer of $Ti_xAl_yCr_zSi_vN$ has a thermal conductivity of less than 3 W/mK.

8. The coated cutting tool according to claim 1, wherein a thickness of the layer of $Ti_xAl_yCr_zSi_vN$ is from 0.5 to 6 μm.

9. The coated cutting tool according to claim 1, wherein there is at least one metal nitride layer between the substrate and the layer of $Ti_xAl_yCr_zSi_vN$.

10. The coated cutting tool according to claim 9, wherein there is a layer of (Ti,Al)N between the substrate and the layer of $Ti_xAl_yCr_zSi_vN$.

11. The coated cutting tool according to claim 1, wherein the substrate is selected from cemented carbide, cermet, cBN, ceramics, PCD and HSS.

12. The coated cutting tool according to claim 1, wherein the layer of $Ti_xAl_yCr_zSi_vN$ is a HIPIMS (High Power Impulse Magnetron Sputtering)-deposited layer.

* * * * *